United States Patent [19]

Jacobs et al.

[11] 4,330,850
[45] May 18, 1982

[54] MNOS MEMORY CELL

[75] Inventors: Erwin Jacobs, Vaterstetten; Ulrich Schwabe; Dezsoe Takacs, both of Munich, all of Fed. Rep. of Germany

[73] Assignee: Siemens Aktiengesellschaft, Berlin & Munich, Fed. Rep. of Germany

[21] Appl. No.: 146,392

[22] Filed: Apr. 30, 1980

[30] Foreign Application Priority Data

May 10, 1979 [DE] Fed. Rep. of Germany ....... 2918888

[51] Int. Cl.³ .............................................. G11C 11/40
[52] U.S. Cl. .................................... 365/185; 365/184; 357/23
[58] Field of Search ................. 365/184, 185, 182; 357/23, 67, 23 VT; /

[56] References Cited

U.S. PATENT DOCUMENTS

| | | | |
|---|---|---|---|
| 3,836,992 | 9/1974 | Abbas et al. | 365/185 |
| 4,128,670 | 12/1978 | Gaensslen | 357/67 |
| 4,225,945 | 9/1980 | Kuo | 365/182 |
| 4,227,202 | 10/1980 | Tasch et al. | 357/24 |

OTHER PUBLICATIONS

Das Gupta et al. "Dual—Gate FAMOS Memory Cell", IBM Tech. Disc. Bul., vol. 17, No. 8, 1/75, pp. 2266.
Hagiwara et al., "A 16 Bit Electrically Erasable PROM Using N-Channel Si-Gate MNOS Technology," IEEE Jour. of S-S Circuits, vol. SC-15, No. 3, 6/80, pp. 346-353.

Primary Examiner—Stuart N. Hecker
Attorney, Agent, or Firm—Hill, Van Santen, Steadman, Chiara & Simpson

[57] ABSTRACT

The invention relates to a MNOS memory cell arrangement in VLSI (very large scale integration) technology comprised of a multi-layer gate insulating layer covering a surface of a semiconductor body in the region between the source and drain zones. In order to avoid breakdowns at the source and drain zone edges before an erasure voltage is attained, the gate electrode is split into two electrodes, which can be operated in different ways and which are superimposed on upon another. These gate electrodes are connected via self-aligned, overlapped contacts. This arrangement resolves "short channel erasure", even in the case of VLSI technology. The invention can be applied as required to MNOS EEPROM memory devices.

8 Claims, 10 Drawing Figures

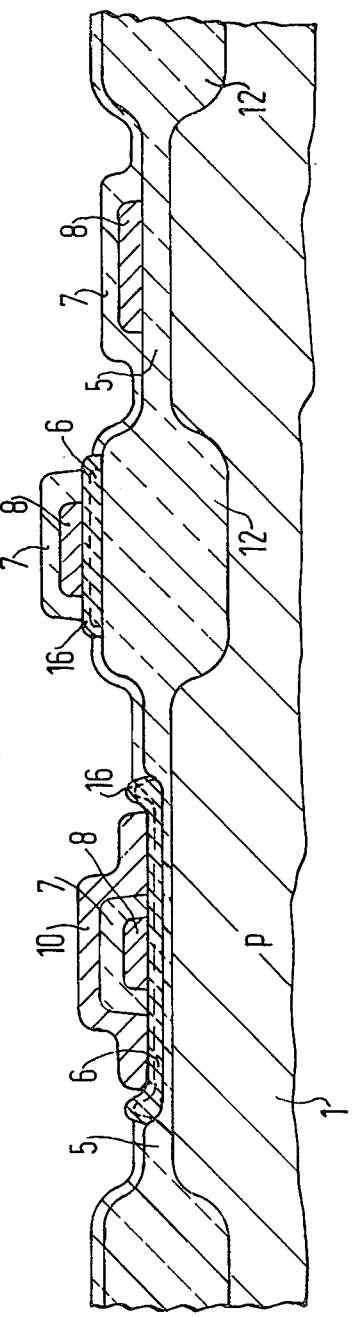
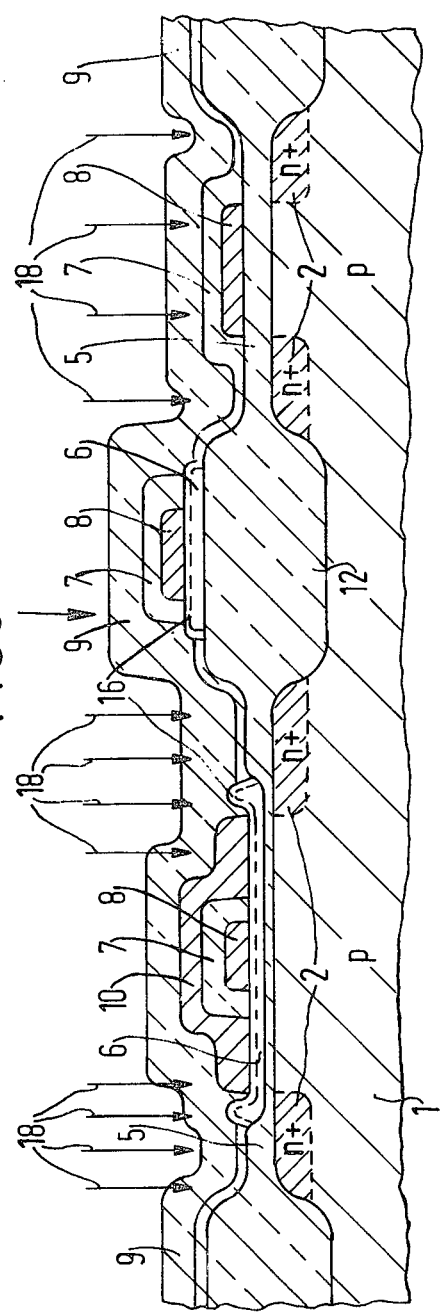

MNOS MEMORY CELL

BACKGROUND OF THE INVENTION

1. Field of the Invention

The invention relates to memory cell arrangements, processes for operating such arrangements and methods of fabricating such arrangements. Somewhat more particularly, the invention relates to a memory cell arrangement comprised of a semiconductor body of a first conductivity type in which a plurality of MNOS components, including source and drain zones of a second conductivity type, which is opposite to that of the first conductivity type, are arranged and includes a multi-layer gate insulating layer which covers the surface of the semiconductor body in the region between the source and the drain zones.

2. Prior Art

The operation mode of a MNOS (metal-nitride-oxide semiconductor) memory cell is based on the fact that in a MNOS field effect transistor, the conductance state which is determined for a given gate voltage and the threshold voltage of the transistor, respectively, are permanently altered by charges which are trapped in the gate double insulating layer. During programming, a positive voltage pulse causes negative charges to be stored at the nitride-oxide interface and inside the nitride, respectively, in the addressed transistors, thereby rendering such transistors permanently blocked. The charges can be disintegrated by a pulse of the reverse polarity or by other erasing processes. One such process, sometimes referred to as "short channel erasure" comprises connecting a positive voltage pulse to the source and drain zone while connecting the substrate and gate to ground potential.

The manufacture of highly integrated circuits (VLSI-very large scale integration-technology) necessitates relatively thin gate oxides (having a maximum thickness of about 50 nm) and relatively flat diffusion zones (smaller than about 0.5μm). These requirements result in a reduction in the avalanche breakdown voltage at the drain-side of the pn-junctions. In instances of short channel erasure of silicon dioxide/silicon nitride double insulating layer memory elements (MNOS transistors), the erasure process (sometimes referred to as a punch-through breakdown) is complicated because the transistors break down before the erasure voltage is reached at the pn-junction of the source-drain zone.

In device components which exhibit a relatively low degree of integration, premature pn-avalanche breakdown of short-channel transistors is avoided, for example, by using thick gate oxide layers (100 to 200 nm) or by producing deep-diffused source/drain zones (1 to 1.5μm). Another means of avoiding premature pn-avalanche breakdown comprises of providing a so-called split gate arrangement which is characterized by a thick gate oxide at the drain edge (see I. R. Cricchi et al., Technical Digest IEDM, Washington, DC, page 126, 1973).

However, when higher degrees of integration are required (VLSI technology), split-gate arrangements can no longer be utilized. Further, additional reductions of the channel length involve serious technological difficulties.

SUMMARY OF THE INVENTION

The invention provides a MNOS memory cell arrangement wherein breakdown at the source and drain edges is avoided and "short channel erasure" problems in VLSI structures having the MNOS storage cells of the invention are resolved.

In accordance with the principles of the invention, a memory cell is comprised of a semiconductor body of a first conductivity type having a plurality of MNOS components therein, including source and drain zones of a second conductivity type opposite to that of the first conductivity type, and includes a multi-layer gate insulating layer covering the surface of the semiconductor body in the region between the source and drain zones, with the gate electrode being split into two electrodes (dual gate) superimposed one on another, connected via self-aligned, overlapped contacts and operable in different ways.

In certain embodiments of the invention, the edges of a second gate electrode, which is located above a first gate electrode (storage gate) are arranged so as to be vertical relative to the plane of the substrate surface and self-aligned relative to the edges of the source and drain zone, while the nitride storage layer partially extends beyond the region of the channel zone toward the source and drain zone.

In certain embodiments of the invention, the double gate electrodes are constructed in double-polysilicon technology. Further, in the practice of the invention one can use silicides, particularly molybdenum, titanium or tungsten silicides. In preferred embodiments of the invention, the semiconductor body is composed of doped silicon.

BRIEF DESCRIPTION OF THE DRAWINGS

FIGS. 3–8 are elevated, partial, cross-sectional, somewhat schematic views of a device undergoing a fabrication sequence in accordance with the principles of the invention;

DESCRIPTION OF THE PREFERRED EMBODIMENTS

Figure 1:
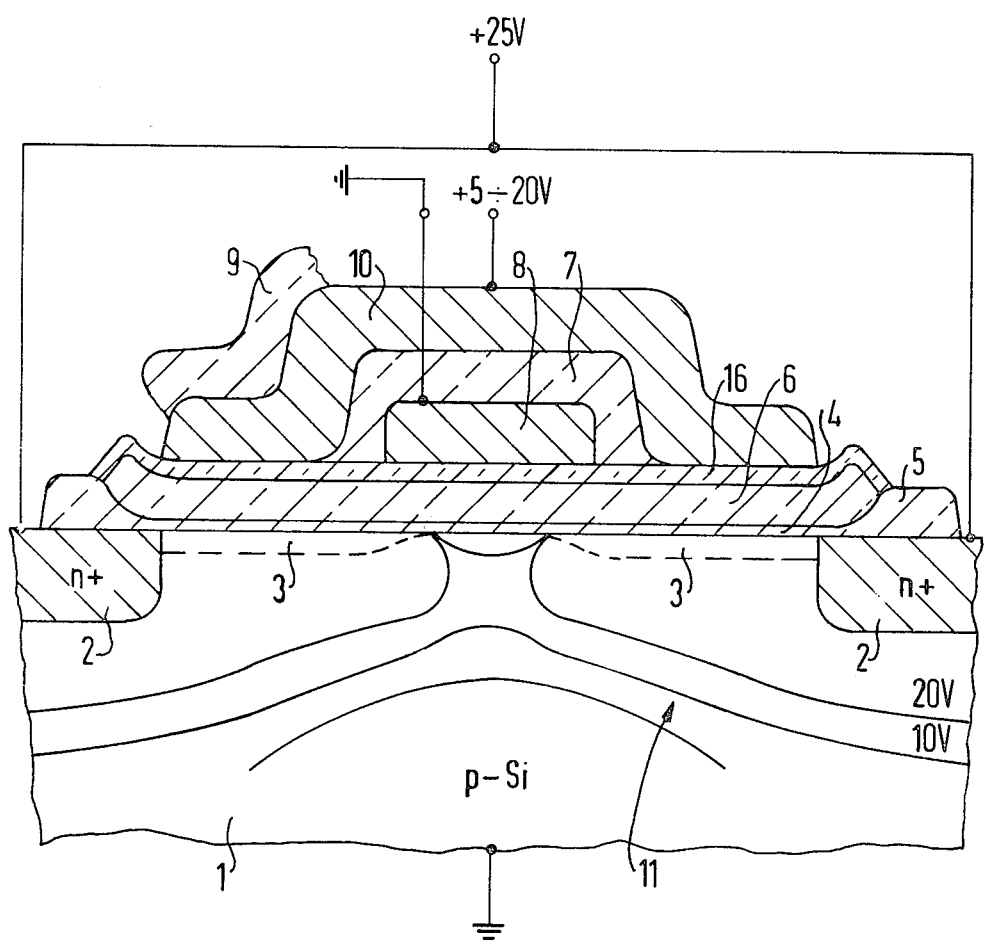
FIG. 1 is an elevated, partial, cross-sectional and somewhat schematic view of a memory cell arrangement with a double gate electrode constructed and operable in accordance with the principles of the invention.

The invention provides an improved MNOS memory cell useful in VLSI technology and having a multi-layer gate insulating layer covering surface areas of a semiconductor body in the regions between the source and drain zones wherein the gate electrode is split into two electrodes which are superimposed upon one another, connected via self-aligned overlapped contacts and which are operable in different ways; a method of fabricating such MNOS memory cells and a process of operating such cells.

In the development of the invention, it was noted that when a conventional gate electrode is split into two electrodes which are superimposed one on another and which are operated in different ways, the ICT (inversion charge transistor) effect [described in detail by R. R. Troutman et al., IEEE Journal of Solid State Circuits, SC13, page 490, (1978)] is used to produce a strong erasing field beneath the storage gate of MNOS transistors. As can be seen from FIG. 1, because of the symmetrical field distribution and the fact that the equipotential lines 11 extend essentially flat beneath the storage gate 8, and earlier punch-through breakdown is achieved. The storage nitride 6, which remains beneath the ICT gate 10, amplifies the electrical field above the inversion layer 3, approximately in accordance with the relation:

$$\epsilon_{Si_3N_4} \approx 2 \epsilon_{SiO_2}$$

when compared with a conventional $SiO_2$ insulating layer. A further effect of the nitride layer is to reduce the potential drop in the edge zone of the poly-Si 2 (structure 10) and to displace the gate-controlled avalanche breakdown at the source and drain edges (corner breakdown) toward higher voltages. In this manner, the breakdown probability shifts from the undesired avalanche breakdown toward the desired punch-through breakdown. At the same time, the erasing effect can be amplified by shortening the length of the storage gate 8.

In an exemplary embodiment of the invention wherein a n-channel MNOS transistor operates as a memory cell, a strong erasing field beneath the storage nitride layer is produced by simultaneously connecting the source and drain zones to an erasing voltage in the range of 10 to 30 volts and connecting the gate electrode 2 (poly-Si 2) to a voltage exceeding 0 volts. In preferred embodiments, this gate voltage (gate 2) is in the range between about 5 to 20 volts and the source/drain voltage is about 25 volts. The substrate and gate electrode 1 carry ground potential.

Further details of the inventive principles can be derived from the following discussion, taken in conjunction with the drawings. FIG. 1 illustrates the potential distribution during short channel erasure beneath a MNOS storage cell having a double gate electrode in accordance with the invention. In this arrangement, structure 1 is a p-doped (100-oriented silicon crystal body; structure 2 is a n+-doped source and drain zone; structure 3 is an inversion layer; structure 4 is a tunnel oxide; structure 5 is a gate oxide ($SiO_2$); structure 6 is a storage nitride layer; structure 16 is an oxynitride layer; structure 7 is an insulating oxide; structure 8 is a poly-Si 1 layer which functions as a storage gate; structure 9 is an intermediate oxide and structure 10 is a poly-Si 2 layer which acts as a second gate. The equipotential lines located beneath the storage gate 8 are schematically indicated at 11.

As can be seen from FIG. 1, the inversion zone 3 is essentially flat where it enters the region beneath the storage gate 8. Since the inversion layer is designed to be self-aligned relative to gate 1, an extremely short channel length (up to a maximum of about 1$\mu$m) can be obtained so that the breakdown field is further increased.

Figure 2:
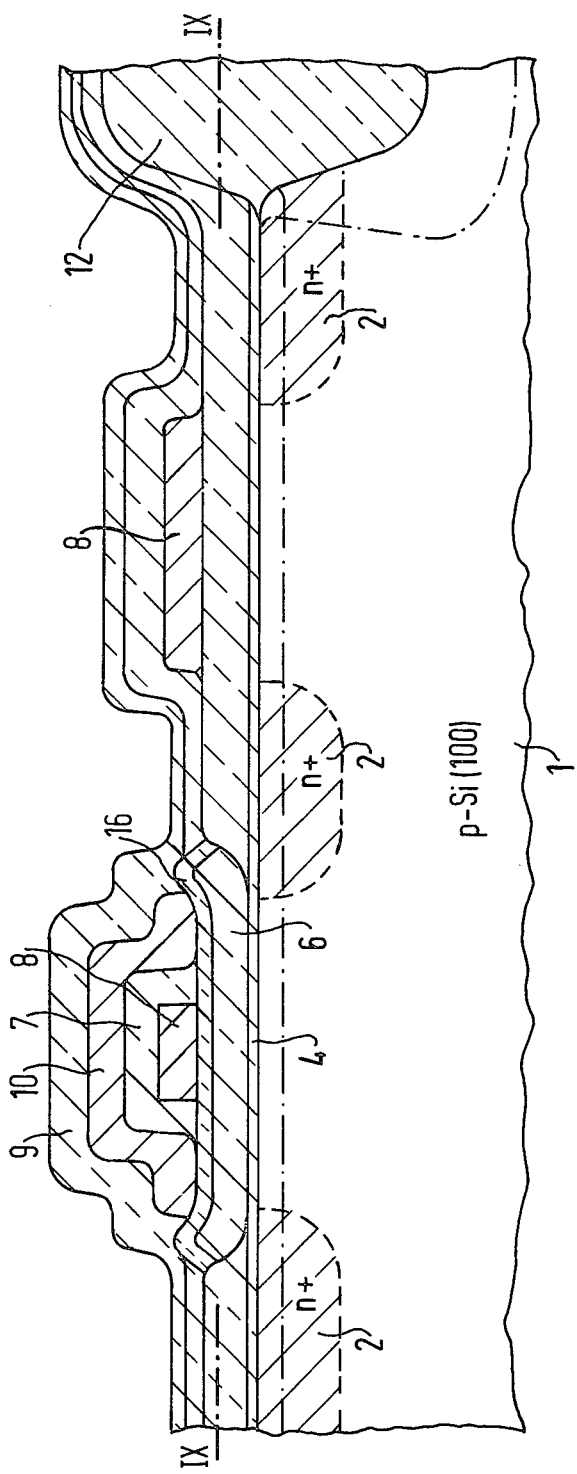
FIG. 2 is a somewhat similar view taken through a two-transistor storage cell constructed and operable in accordance with the principles of the invention (with the switching transistor on the right).

FIG. 2 illustrates a section taken through a two-transistor storage cell (with the switching transistor on the right) constructed in accordance with the principles of the invention. The reference numerals are identical to those used above in conjunction to FIG. 1 and refer to similar structures.

The fabrication procedure for producing, for example, a n-channel polysilicon-gate-MNOS memory transistor of the invention is described below in conjunction with FIGS. 3–8.

Figure 3:
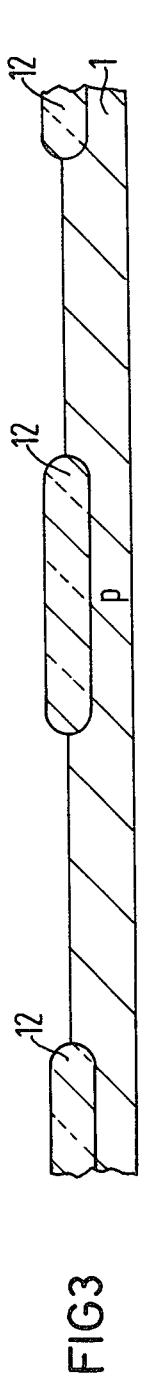

FIG. 3 illustrates a p-doped (100)-orientated silicon substrate 1 which, via an isoplanar process, also known as a LOCOS (local oxidation of silicon) process, is provided with a structured $SiO_2$ layer 12 (so-called field oxide layer) to divide-up the active transistor zones. Although not shown in the illustration, in this process, the p-doped silicon substrate 1 is first coated with a 50 nm thick silicon oxide layer and then coated with a 100 nm thick silicon nitride layer. After structuring, a 700 nm thick $SiO_2$ layer 12, which acts as a thick oxide, is oxidized onto the silicon substrate and thereafter the silicon nitride layer is removed.

Figure 4:
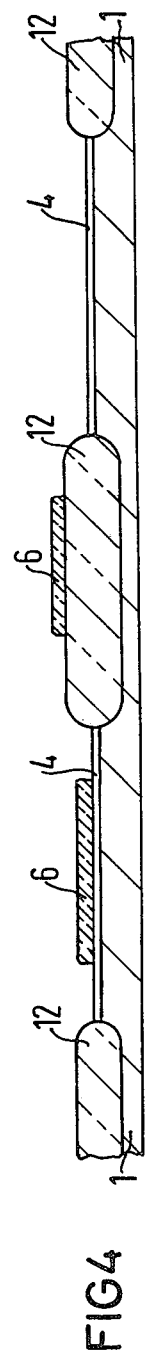

Next, as illustrated at FIG. 4, a 3 nm thick $SiO_2$ layer 4, which functions as a tunnel oxide is deposited onto the entire substrate surface. Then a so-called storage nitride layer 6 is applied in a thickness of about 40 nm and structured via conventional mask technology so that it remains in select regions of the memory transistor and at areas at which the overlapped polysilicon-metal contact will be produced.

Figure 5:
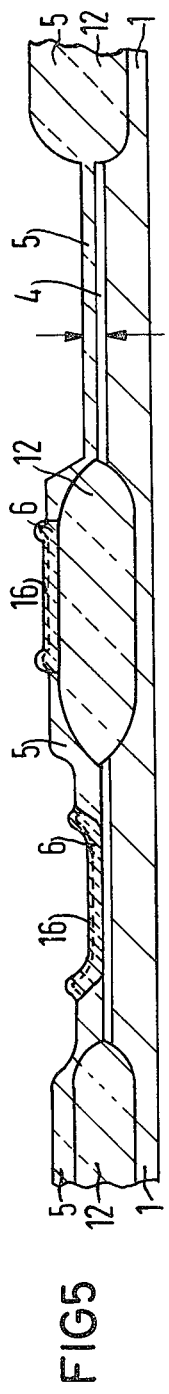

Thereafter, as shown in FIG. 5, a 50 nm thick $SiO_2$ layer 5, which acts as a gate oxide, is applied via thermo-oxidation, during which the surface of the silicon nitride layer 6 is transformed into an approximately 15 nm thick oxynitride layer 16. As an alternative to thermal oxidation, a $SiO_2$ can be deposited and it then functions as a blocking layer in place of the oxynitride layer.

Figure 6:
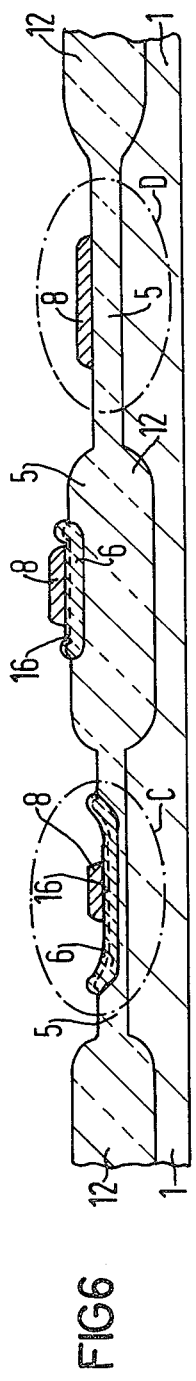

Next, as illustrated in FIG. 6, a polysilicon layer 8 (Poly-Si 1) is deposited in a thickness of approximately 500 nm and is structured. In order to improve the clarity of the illustration, the two $SiO_2$ layers 4 and 5 have been shown in FIG. 6 and subsequent illustrations as a single layer 5a. Otherwise, all structures shown are referenced with the same reference numerals as set forth earlier in conjunction with FIG. 1. The zone outlined by dash-dot line C in FIG. 6 is a sub-zone of a storage transistor whereas the dash-dot line D encloses a normal transistor of the arrangement.

After the deposition and structuring of the Poly-Si 1 layer 8, functions as a storage gate, an insulating oxide layer 7 is applied in a thickness greater than about 50 nm, up to 250 nm and structured as shown. Next, a polysilicon layer 10 (Poly-Si 2), which functions as an ICT gate is deposited and structured.

Then the source-drain zones are produced via arsenicion implantation through the oxynitride/nitride layers 16,6 and the gate oxide 5 at a concentration of, for example, $1 \cdot 10^{16}$ As+cm$^{-2}$ at 150 keV (schematically indicated by arrows 18) so that the n+-zones 2 are formed (FIG. 8).

After implantation and annealing, an intermediate oxide 9 is applied a thickness of about 70 nm and then structured in a conventional manner to produce contact holes. Thereafter, metallization and application of a protective layer, for example in the form of phosphorous glass, occurs as in a conventional double silicon gate process (now shown).

Figure 9:
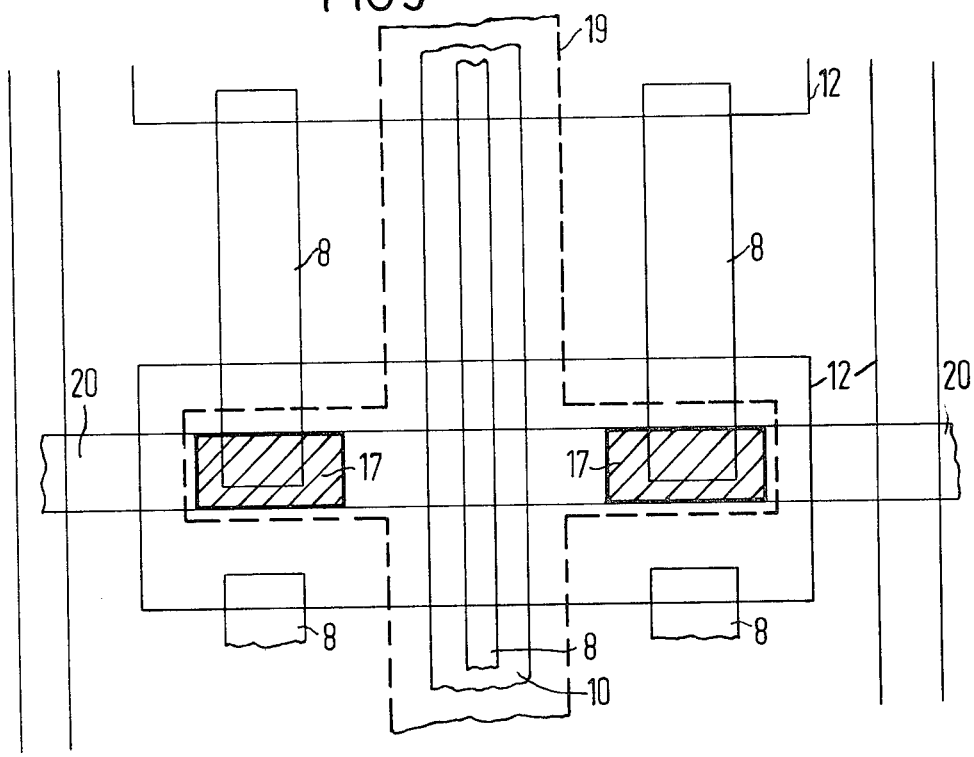
FIG. 9 is a somewhat sectional view taken along lines IX—IX of FIG. 2 illustrating a layout of a MNOS storage cell have a three-transistor arrangement constructed and operable in accordance with the principles of the invention.

The polysilicon zones 8 and 10 for the polysilicon-metal contact above the thick oxide layer 12 are not positioned on a $SiO_2$ layer as is normal, but instead are positioned on the silicon nitride layer 6. In this manner, no underetching of the polysilicon layers 8 and 10 occurs during etching of contact holes (which would allow the edges of the applied metal paths to break-off), because the nitride layer 6 functions as an etch-stop means. Further, this allows the attainment of a self-aligned, overlapped polysilicon contact which represents the connection of the gate electrodes of the two switching transistors (FIG. 9). The space requirements for a contact is reduced to less than half the normal contact surface. Consequently, the packing density of the cell is substantially increased. This is a further advantage of devices constructed in accordance with the principles of the invention.

FIG. 9 illustrates a layout of a MNOS storage cell in a three-transistor arrangement taken along line IX—IX of FIG. 2. The various structure details which have been described in conjunction with FIGS. 1-8 are here referenced with the same reference numerals used earlier. In FIG. 9, the shaded zone represents contact holes 17: the strip zone 20 is the metallization and the broken-line zone 19 represents the MNOS mask.

Figure 10:
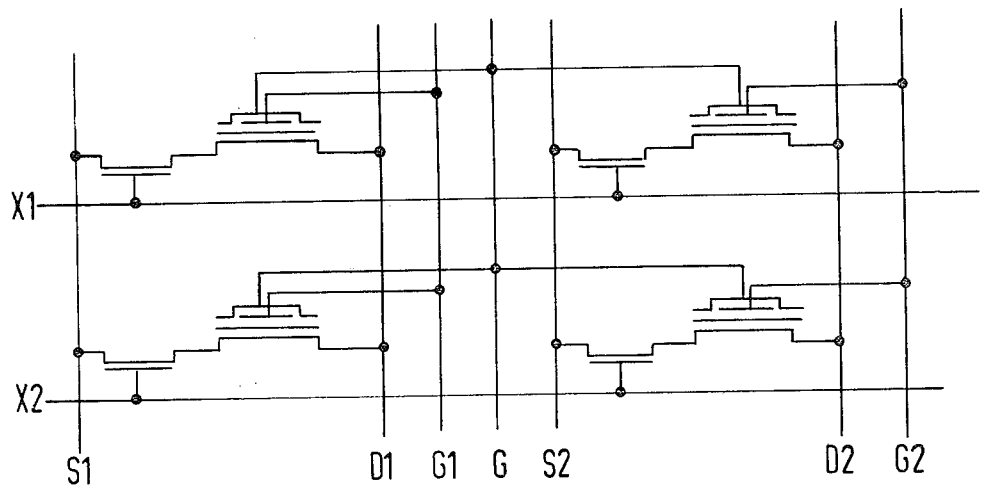
FIG. 10 is a somewhat schematic view of a circuit diagram for a cell having a 2×2, 2-transistor MNOS memory matrix constructed and operable in accordance with the principles of the invention.

FIG. 10 schematically illustrates a cell arrangement of a 2×2, 2-transistor MNOS memory matrix. In this illustration, S1 and S2 are source terminals; D1 and D2 are drain terminals; X1 and X2 are word lines; G1 and G2 are bit lines; and G is the ICT (inversion charge transistor) gate line. As can be seen from the symmetry of this arrangement, any desired n×m matrix (wherein n and m are integers) can be formed from the 2×2, 2 trnsistor MNOS memory matrix.

As is apparent from the foregoing specification, the present invention is susceptible of being embodied with various alterations and modifications which may differ particularly from those that have been described in the preceeding specification and description. For this reason, it is to be fully understood that all the foregoing is intended to be merely illustrative and is not to be construed as being restrictive or otherwise limiting of the present invention, excepting as it is set forth and defined in the heretoappended claims.

We claim as our invention:

1. In a memory cell comprised of a semiconductor substrate of a first conductivity type, said substrate having arranged in the surface thereof a plurality of MNOS components including source and drain zones of a second conductivity type opposite to that of said first conductivity type, and a multi-layer gate insulating layer which includes a gate electrode and covers a surface of said semiconductor substrate in the regions between said source and drain zones, the improvement comprising wherein
    said gate electrode comprises first and second gate electrodes operable in different ways and which are superimposed one upon another (dual gate) and are connected via self-aligned overlapped contacts,
    said second electrode being located above said first gate electrode and edges of said second gate electrode being arranged so as to be vertical relative to the plane of said semiconductor substrate surface and self-aligned to edges of said source and drain zones;
    said cell having a storage nitride layer partially extending beyond the region of a channel zone toward the region of said source and drain zones.

2. In a memory cell as defined in claim 1 wherein said semiconductor substrate is composed of doped silicon.

3. In a memory cell as defined in claim 1 wherein said first and second gate electrodes are constructed in double polysilicon gate technology.

4. A memory cell as defined in claim 1 wherein said first and second gate electrodes are composed of a silicide.

5. A memory cell as defined in claim 4 wherein said silicide is selected from the group consisting of molybdenum silicide, titanium silicide and tungsten silicide.

6. A memory cell as defined in claim 1 wherein said cell is integrated into a semiconductor body in the form of a matrix.

7. A process of operating a memory cell as defined in claim 1 wherein said source and drain zones are simultaneously connected to an erasing voltage in the range of about 10 to 30 volts and the second gate electrode is connected to a voltage exceeding 0 volts while the first gate electrode and semiconductor substrate are connected to ground potential whereby a relatively strong erasing field is produced beneath a storage nitride layer.

8. A process for operating as defined in claim 7 wherein said second gate electrode is connected to a voltage in the range of about 5 to 20 volts.

* * * * *